United States Patent [19]

Holmes

[11] 4,395,735
[45] Jul. 26, 1983

[54] FM COUNTER DETECTOR
[75] Inventor: David D. Holmes, Chesterfield, N.J.
[73] Assignee: RCA Corporation, New York, N.Y.
[21] Appl. No.: 297,555
[22] Filed: Aug. 31, 1981
[51] Int. Cl.$^3$ ............................................. H04N 5/62
[52] U.S. Cl. ...................................... 358/198; 358/23
[58] Field of Search ............................. 358/198, 23, 25

[56] References Cited

U.S. PATENT DOCUMENTS 2,750,441 6/1956 Schlesinger ........................ 358/198
3,399,353 8/1968 Avins .

FOREIGN PATENT DOCUMENTS 2849859 5/1979 Fed. Rep. of Germany ...... 358/198

OTHER PUBLICATIONS

Television Sound Signal Recovery Circuit, Freedman, Dec. 1964, RCA Technical Notes, RCA TN No. 593.
A New Counting Pulse Demodulator for SECAM TV Standard Using TTL Circuits, Hajos, L'Onde Electronique, vol. 56, No. 4, pp. 200–203, Apr. 1976.
Frequency Modulation Engineering by C. E. Tibbs, pub. 1947, pp. 234–235.
RCA Datebook on "Linear Integrated Circuits", (1978), p. 348.
Instruction Manual for Tektronix Television Demodulator 1450, Printed Jul. 1979, Audio Section Schematic.

*Primary Examiner*—Michael A. Masinick
*Attorney, Agent, or Firm*—E. M. Whitacre; P. J. Rasmussen; Lawrence C. Edelman

[57] ABSTRACT

A counter-type detector system is provided for a television receiver in which a standard angle modulated intermediate frequency signal is heterodyned to a lower frequency prior to detection by the counter detector. The lower intermediate frequency permits the generation of a pulse signal which is averaged to produce a relatively high level detected output signal. After the angle modulated intermediate frequency signal has been converted to the lower frequency, additional selectivity may be used prior to detection to further attenuate signal frequencies above the lower carrier frequency.

5 Claims, 6 Drawing Figures

FM COUNTER DETECTOR

This invention relates to angle modulation detectors and, in particular, to a frequency modulation counter-detection system in which the intercarrier sound signal is heterodyned to a lower intermediate frequency prior to detection.

U.S. Pat. No. 3,399,353 describes an FM counter-type detector arrangement in which a frequency modulated carrier signal is applied to an oscillator circuit which, in the absence of the applied signal, generates self-oscillations at a frequency which is harmonically related to the center or unmodulated frequency of the carrier signal. When the carrier signal is applied to the oscillator circuit, the circuit locks in frequency and phase with the applied signal to provide an output signal at a frequency related to the frequency of the applied signal. The oscillator output signal is used to develop a pulse signal, including constant area pulses, at a rate related to the frequency of the FM carrier signal. The pulse signal is then averaged to derive the original modulation information.

The FM counter-type detector system described above is especially attractive for consumer oriented products, such as television receivers, because the counter type detector is constructed without tuned circuit elements, such as those necessary for a conventional FM discriminator. The counter detector thus readily lends itself to construction in integrated circuit form. In addition, the use of a counter-type detector results in a very linear demodulation process, as compared to a discriminator relying upon the relatively nonlinear characteristics of a conventional tuned circuit.

It has been found that the counter-type detector produces a relatively low level detected signal. By increasing the mark-to-space ratio, or duty cycle, of the pulse signal which is averaged to recover the modulating information, the signal level can be increased, but a maximum ratio is quickly attained at which the duration of the constant area pulse approaches the duration of one period of the highest instantaneous modulated carrier frequency. Even at this maximum mark-to-space ratio, the detected signal level is normally relatively low. Accordingly, it is desirable to increase the demodulated signal level of the counter detector.

In accordance with the principles of the present invention, a counter-type detector system is provided for a television receiver in which the angle modulated intermediate frequency signal is heterodyned to a lower frequency prior to detection by the counter detector. The lower intermediate frequency permits the generation of a pulse signal which is averaged to produce a relatively high level detected output signal. After the angle modulated intermediate frequency signal has been converted to the lower frequency, additional selectivity may be used prior to detection to further attenuate signal frequencies above the lower carrier frequency.

In a first embodiment of the present invention, a counter detector system is employed in the sound channel of a television receiver. The conventional sound i.f. signal is heterodyned with the television color subcarrier to produce a second sound i.f. signal at the difference frequency of these two signals. The second sound i.f. signal is further filtered prior to detection by the counter detector, which produces a relatively high level output signal as a result of the heterodyning process.

In a second embodiment of the present invention, the principles of the present invention are employed in a SECAM color signal demodulator. The frequency-modulated SECAM color signals are heterodyned with the sound carrier in a SECAM television receiver to produce FM color signals at lower frequencies. The color signal information is then recovered by a single counter-type detector.

Figure 1:
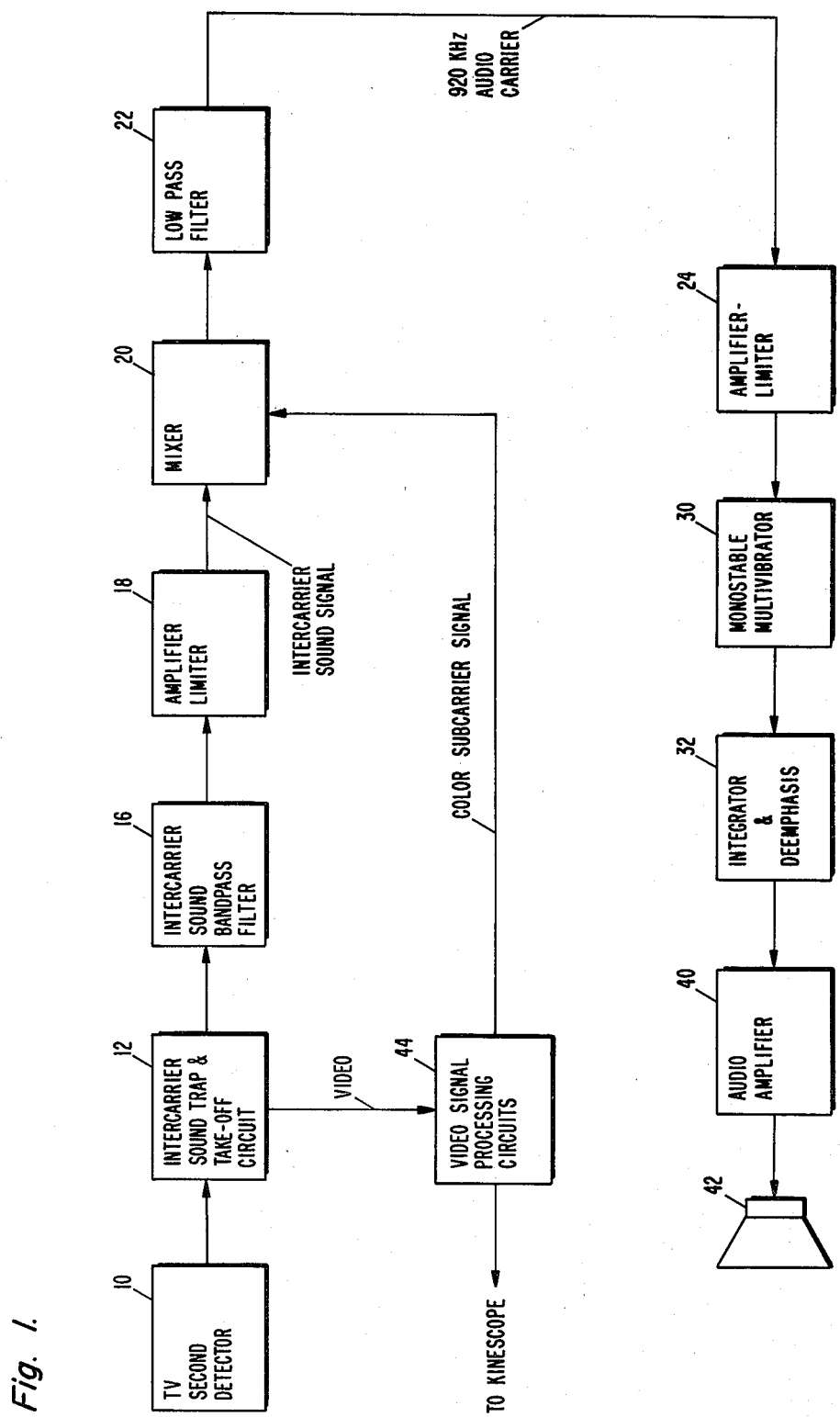
FIG. 1 illustrates, in block diagram form, a counter-type detector system in the sound channel of a television receiver constructed in accordance with the principles of the present invention.

Referring to FIG. 1, a television sound channel constructed in accordance with the principles of the present invention is shown. A television second detector 10 produces baseband video and intercarrier sound signals at its output. These signals are applied to the input of an intercarrier sound trap and take-off circuit 12. This circuit may be constructed as shown in U.S. patent application Ser. No. 85,312 filed Oct. 26, 1979, and entitled "SIGNAL SEPARATION NETWORKS". This circuit operates to separate the intercarrier sound and video signals. The video signal, including a color burst component, is applied to video signal processing circuits 44, which process the video signal for display of the video information on a television kinescope (not shown). The intercarrier sound signal is applied to the input of an intercarrier sound bandpass filter 16. In the U.S. NTSC system, the color burst signal component has a frequency of approximately 3.58 MHz, and the intercarrier sound signal, or sound i.f. signal, comprises audio information frequency modulated on a 4.5 MHz carrier.

The intercarrier sound signal bandpass filter 16 passes signals in the vicinity of the intercarrier sound signal frequency. This filter has a center or resonant frequency equal to the intercarrier sound signal carrier (e.g., 4.5 MHz) and may comprise, for example, a ceramic filter. The filtered intercarrier sound signal is then amplified and limited by an amplifier-limiter stage 18, and the amplified and limited signal is applied to one input of a mixer 20. The second input of the mixer 20 is coupled to receive a color subcarrier signal from the video signal processing circuits 44, which include a conventional automatic frequency and phase control circuit for producing a phase-locked color subcarrier signal in response to the color burst signal component. The color subcarrier signal is also used to demodulate color signals in the video signal processing circuits in the normal manner.

The mixer 20 heterodynes the intercarrier sound signal of nominally 4.5 MHz with the color subcarrier signal of 3.58 MHz to produce a difference signal of 920 KHz; frequency modulated by audio information. This difference signal, the second sound i.f. signal, is filtered by a lowpass filter 22 to attenuate signals of frequencies above the frequency of the modulated 920 KHz signal. The second sound i.f. signal is amplified and limited by an amplifier-limiter 24 and applied to the input of a monostable multivibrator 30, which produces a train of constant width pulses in response to transitions of the second sound i.f. signal of a given sense (i.e., positive-going transitions or negative going transitions). The train of constant width pulses is averaged to recover the audio information and the recovered audio signal is deemphasized by an integrator and deemphasis circuit 32. The audio signal is applied to an audio amplifier 40 and a loudspeaker 42 for reproduction of the audio information.

Figure 3:
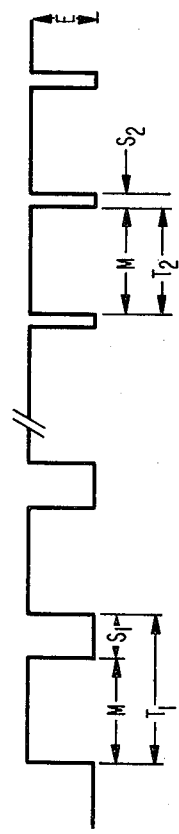
FIG. 3 illustrates a pulse signal used to explain the operation of the embodiments of FIGS. 1 and 2.

The effect of the generation of the second sound i.f. signal is seen by referring to the pulse train diagram of FIG. 3. Referring to FIG. 3, a typical pulse train produced by the monostable multivibrator 30 from two modulating frequencies is shown. At a low modulating frequency $f_2$, the pulse train has a cycle of $T_1$ duration, including a fixed duration pulse M and a space $S_1$. At a high modulating frequency $f_1$, the pulse train has a cycle of $T_2$ duration, including the fixed duration pulse M and the shorter space $S_2$. The pulse train has a constant amplitude, E. When the pulse train is averaged by circuit 100, the recovered audio signal will have an average energy content of:

$$E_{AV}=E \cdot (M/T)$$

which, for the high and low modulating frequencies is equal to $$E_{av}=EM\,(1/T_2-1/T_1)=EM(f_2-f_1).$$

This function is seen to be linear, and is proportional to the voltage supply which determines E, the frequency deviation $f_2-f_1$, and the width of the pulses M. The width of the pulses M cannot exceed the period $T_2$ of the highest instantaneous frequency during frequency modulation for recovery of the audio information. Thus, the pulse width M is bounded by zero and $1/(f_c+(f_2-f_1)/2)$ microseconds, where $f_c$ is the carrier frequency. When the carrier frequency is changed from 4.5 MHz to 920 KHz, the duration of the M pulse can be increased in the ratio of 4500/920, or 14 dB. Thus, the audio output is increased by 14 dB by the use of the second sound i.f. signal.

Figure 2:
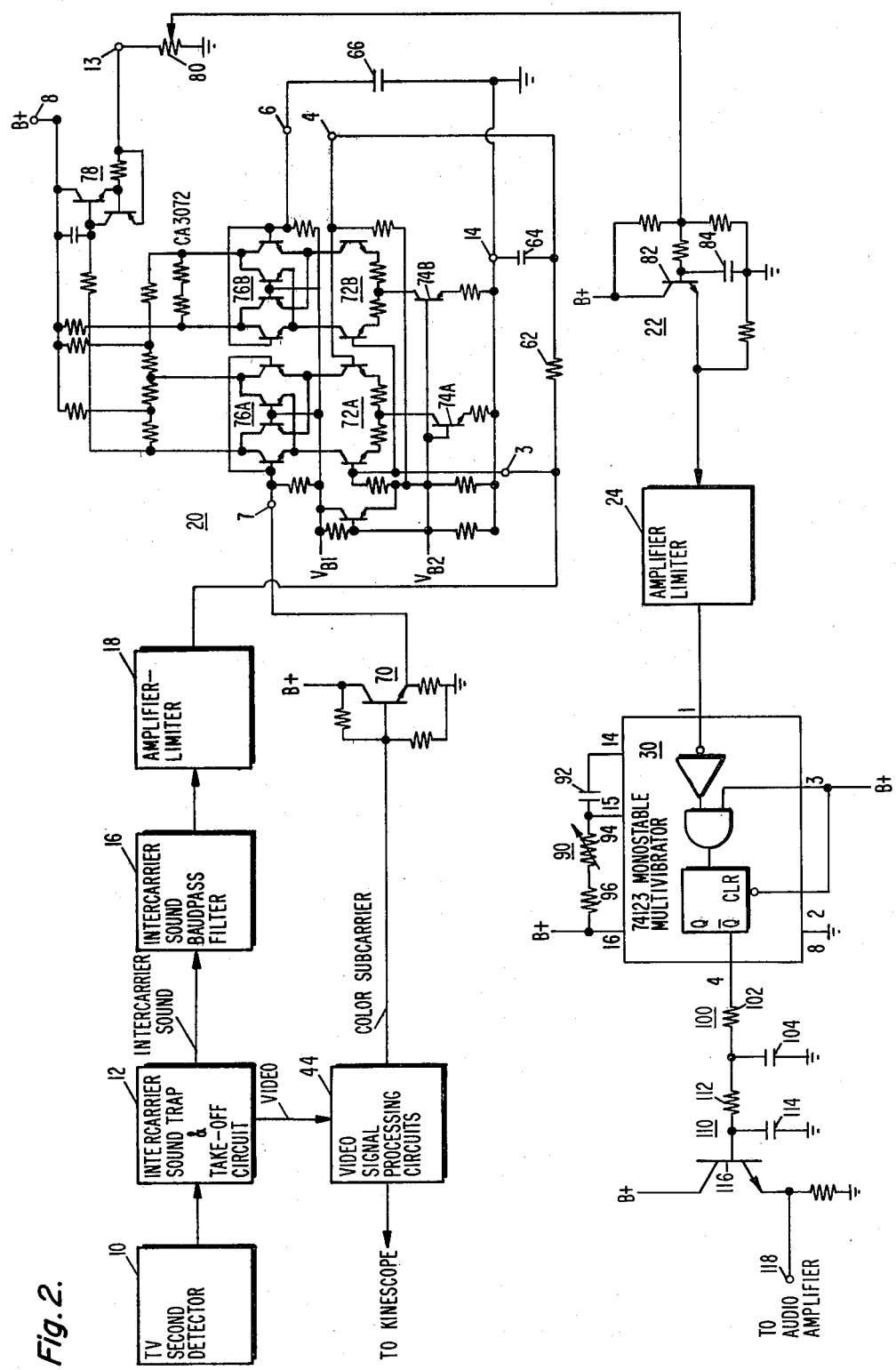
FIG. 2 illustrates, partially in block diagram form and partially in schematic diagram form, a more detailed embodiment of the system of FIG. 1.

The arrangement of FIG. 1 is shown in further detail in FIG. 2. In this embodiment, the mixer 20 comprises a commercially available CA3072 chroma demodulator integrated circuit coupled to perform the mixing function. Pin 8 of the integrated circuit is coupled to a source of supply voltage (B+), and pin 14 is coupled to a source of reference potential (ground). Bias voltage circuits internal to the integrated circuit (not shown) develop bias voltages $V_{b1}$ and $V_{b2}$. The mixing function is performed by doubly balanced modulators including amplifier sections 72a and 72b, and switching sections 76a and 76b, which receive current from current sources 74a and 74b.

The intercarrier sound signal produced by the amplifier-limiter 18 is supplied by way of an input terminal 3 to the left sides of the amplifier sections 72a and 72b. The intercarrier sound signal is also coupled by way of a series resistor 62, a shunt capacitor 64, and an input terminal 4 to the right sides of the amplifier sections. The amplifier sections provide amplified intercarrier sound signals to the emitter-coupled switching sections 76a and 76b.

The color subcarrier signal from the video signal processing circuits 14 is applied by way of an emitter-follower coupled transistor 70 and an input terminal 7 to one side of the switching sections 76a and 76b. The other side of the switching sections is coupled to signal reference potential by an input terminal 6 and a capacitor 66. The difference signal produced at the outputs of the switching section is coupled by way of a lowpass filter output stage 78 to an output terminal 13.

A potentiometer 80 is coupled between output terminal 13 and ground, and is used as a gain-determining control element. The intercarrier sound second i.f. signal is taken from the wiper arm of the potentiometer 80 and applied to the input of an active lowpass filter 22, including an emitter-follower coupled transistor 82 and a capacitor 84. The filter 22 rolls off signals of frequencies above approximately 1.5 MHz to reduce the effects of impulse noise on the sound system. The filtered 920 KHz signal is coupled by way of amplifier-limiter 24 to an input terminal 1 of a 74123 type monostable multivibrator integrated circuit. Pins 2, 3 and 16 of the 74123 integrated circuit are coupled to the B+ supply, and pin 8 of the integrated circuit is coupled to ground. A time constant circuit 90, including a resistor 96, a potentiometer 94, and a capacitor 92 is coupled to pins 16, 15 and 14 of the 74123 integrated circuit to determine the duration of the pulses produced by the circuit. In this embodiment, the time constant circuit 90 is adjusted to produce pulses of approximately 0.85 microsecond duration. The resultant pulse train at the output terminal 4 thus has a very high duty cycle, or mark-to-space ratio. Since the modulated 920 KHz signal can have cycles varying between approximately 1.058 and 1.117 microseconds, the duty cycle of the pulse train will vary between seventy-six and eighty percent.

The pulse train produced by the monostable multivibrator 30 is averaged by an integrating circuit 100, including a series coupled resistor 102 and a shunt coupled capacitor 104 to recover the audio information. The audio signal then undergoes conventional FM deemphasis in a deemphasis network 110, including a series-coupled resistor 112 and a shunt-coupled capacitor 114. The audio signal is applied to the base of an emitter follower coupled output transistor 116, to produce an audio output signal at an output terminal 118.

Figure 4:
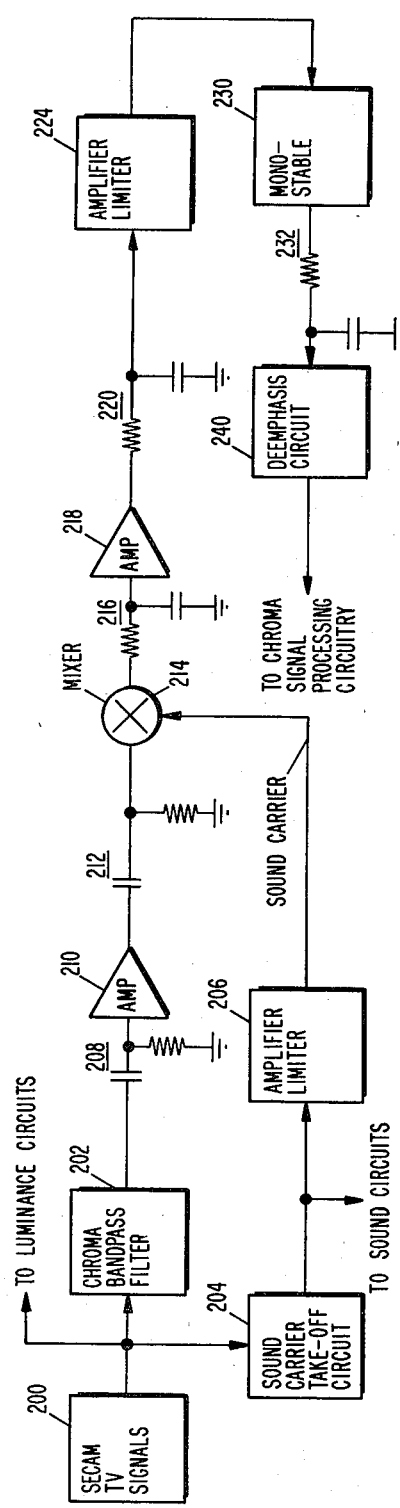
FIG. 4 illustrates a SECAM color signal detector constructed in accordance with the principles of the present invention.
Figure 5A:
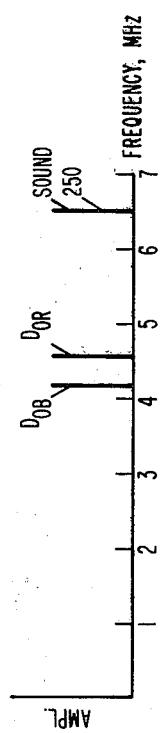
FIGS. 5a and 5b illustrate the frequency location of certain signals used to explain the operation of the embodiment of FIG. 4.

The principles of the present invention may also be applied to a SECAM system color demodulator, as shown in the embodiment of FIG. 4. A source of SECAM television signals 200 produces frequency modulated chrominance subcarriers $D_{OB}$ and $D_{OR}$ at approximately 4.25 and 4.4 MHz, and an amplitude modulated sound carrier 250 at 6.5 MHz, as shown in the frequency spectrum plot of FIG. 5a. These signals are applied to a chroma bandpass filter 202, which produces the filtered chrominance subcarrier signals at its output, and to a sound carrier take-off circuit 204, which produces the modulated sound carrier at its output. The chrominance subcarrier signals at the output of the filter 202 are filtered by a highpass filter 208, amplified by an amplifier 210, filtered by a further highpass filter 212, and applied to the input of a mixer circuit 214. The modulated sound carrier at the output of the circuit 204 is applied to sound demodulating circuitry (not shown) and to an amplifier-limiter 206. The amplified and limited sound carrier at the output of the amplifier-limiter 206 is applied to a second input of the mixer 214.

Figure 5B:
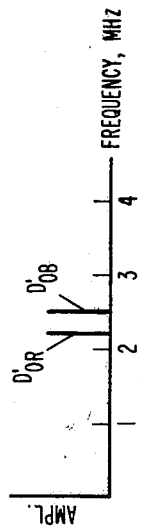

The mixer 214 produces difference signals by intermodulating the chrominance subcarrier signals and the sound carrier signal. The chrominance subcarrier difference signals are developed at approximately 2.1 and 2.25 MHz as shown by subcarrier $D'_{OR}$ and $D'_{OB}$ in FIG. 5b. Signals above these frequencies are attenuated by a lowpass filter 216 and the chrominance subcarrier signals are further amplified by an amplifier 218, then filtered again by a lowpass filter 220. The chrominance subcarrier signals are amplified and limited by an amplifier-limiter 224 and applied to a monostable multivibrator 230, which produces constant width pulses in response to transitions of the amplified and limited chrominance subcarrier signals. The widths of these pulses are again set to be slightly less than the period of the highest instantaneous frequency of the modulated subcarrier signals. The pulse train produced by the monostable multivibrator 230 is averaged by an averaging circuit 232 to recover the color information and the color signals are deemphasized by a deemphasis circuit 240. The color signals are then applied to chroma signal processing circuitry (not shown) for further processing.

Since the SECAM chrominance subcarrier signals $D_{OB}$ and $D_{OR}$ are transmitted on alternate lines of the video signal, and the counter detector is perfectly linear, only a single detector (monostable multivibrator 230 and averaging circuit 232) is required to demodulate both signals. Demodulation at the lower carrier intermediate frequencies increases the levels of the recovered color signals as compared with demodulation at their higher intermediate frequencies, and also permits the use of lowpass filters 216 and 220 for additional selectivity and improved performance in the presence of noise.

What is claimed is:

1. In a SECAM television receiver, including means for producing frequency modulated chrominance subcarrier signals and an amplitude modulated sound carrier signal of a given frequency, a counter detector demodulation system comprising:
   amplifier-limiter means, responsive to said sound carrier signal for producing a continuous wave reference signal at said given frequency of substantially constant amplitude;
   a mixer having a first input coupled to receive said chrominance subcarrier signals, a second input coupled to receive said reference signals, and an output at which a difference frequency signal frequency modulated with chrominance information is produced;
   means responsive to said difference frequency signal for producing a train of constant width pulses in response to transitions of said difference frequency signal;
   an averaging circuit coupled to receive said constant width pulse train for producing recovered chrominance information signals; and
   a chrominance signal utilization circuit coupled to receive said recovered chrominance information signals.

2. The arrangement of claim 1 further comprising:
   a lowpass filter, coupled between said mixer and said pulse train producing means, and having a response characteristic for attenuating frequencies above the frequency of said difference signal.

3. The arrangement of claim 2, further comprising:
   an amplifier-limiter circuit coupled between said mixer and said pulse train producing means for producing a limited replica of said difference signal.

4. The arrangement of claim 1 wherein said pulse train producing means comprises:
   a monostable multivibrator responsive to transitions of said difference signal of a given polarity for producing a train of pulses having constant widths which are less than the period of the highest frequency of said difference signal.

5. The arrangement of claim 1, wherein said utilization circuit includes a deemphasis circuit.

* * * * *